United States Patent [19]

Nakazato et al.

[11] Patent Number: 5,029,323
[45] Date of Patent: * Jul. 2, 1991

[54] SEMICONDUCTOR DEVICE

[75] Inventors: Shinji Nakazato, Maebashi; Hideaki Uchida, Takasaki; Nobuo Tanba, Ohme; Nobuyuki Gotoo; Kazunori Onozawa, both of Takasaki; Atsushi Hiraishi, Hitachi, all of Japan

[73] Assignee: Hitachi, Ltd., Tokyo, Japan

[*] Notice: The portion of the term of this patent subsequent to Jun. 9, 2004 has been disclaimed.

[21] Appl. No.: 399,952

[22] Filed: Aug. 29, 1989

Related U.S. Application Data

[60] Continuation of Ser. No. 44,202, Apr. 30, 1987, which is a division of Ser. No. 843,614, Mar. 15, 1986.

[30] Foreign Application Priority Data

Mar. 25, 1985 [JP] Japan .................... 60-58325

[51] Int. Cl.$^5$ ........................... H01L 27/02
[52] U.S. Cl. ........................ 357/41; 357/42; 357/43; 357/44; 357/45; 357/46; 357/23.6; 357/50; 357/51; 357/55
[58] Field of Search .............. 357/41, 42, 43, 44, 357/45, 23.6, 46, 50, 51, 55

[56] References Cited

U.S. PATENT DOCUMENTS 4,672,416 6/1987 Nakazato et al. .............. 357/46
4,868,626 9/1989 Nakazato et al. .............. 357/42

Primary Examiner—Edward J. Wojciechowicz
Attorney, Agent, or Firm—Antonelli, Terry, Stout & Kraus

[57] ABSTRACT

A semiconductor device facilitates keeping all parasitic resistance values between contact portion of a common source ($V_{cc}$) line and intrinsic collector operation regions of respective transistors small enough so as not to exceed predetermined values and so as to be nearly identical. The parasitic resistance values are made small and nearly identical by disposing collector electrode connecting layers between base impurity introducing layers of respective transistors provided with predetermined intervals in a semiconductor substrate. Because of this arrangement to minimize and equalize resistances, the voltage drops generated by the parasitic resistances applied to respective transistors are suppressed so as to be lower than or not substantially exceed the operation threshold voltages of the parasitic transistors.

6 Claims, 4 Drawing Sheets

SEMICONDUCTOR DEVICE

This is a continuation of application Ser. No. 044,202, filed Apr. 30, 1987, now U.S. Pat. No. 4,868,626 which is a divisional of application Ser. No. 843,614, filed Mar. 25, 1986, now U.S. Pat. No. 4,672,416.

BACKGROUND OF THE INVENTION

The present invention relates to a semiconductor device, and more particularly relates to a semiconductor device which incorporates fine bipolar elements and which is so constituted as to avoid malfunctioning (or breakdown) caused by parasitic elements.

It is important to improve the integration of semiconductor devices such as ICs. In order to realize this aim, processing technology appropriate to the fine structure and layout technology for arranging as many elements as possible on a substrate made of silicon or the like must be developed.

As the integration is improved and the space between elements formed on a substrate becomes smaller, parasitic elements are more likely to occur, and malfunctioning of the circuit and breakdown of the elements is also more likely to occur.

SUMMARY OF THE INVENTION

It is an object of the present invention to provide a semiconductor device which incorporates fine bipolar elements wherein parasitic phenomena are suppressed and the reliability of the device is improved.

Particularly, as the present invention is based upon the discovery of a new parasitic phenomenon which is easily generated between bipolar elements and MOS elements which coexist in an IC, it is especially effective for constitution of such an IC in which different fine elements coexist.

The outline of a typical semiconductor device of the present invention will be hereinunder described.

Two or more vertical NPN transistors are formed in a semiconductor substrate and respective collectors of these NPN transistors are connected to, for instance, a common source potential (the first operation potential) ($V_{cc}$) line. In other words, the connection of each transistor is collector-grounded.

In these collector-grounded transistors (emitter followers), the resistance values of parasitic resistances between the common source ($V_{cc}$)) line and collectors of the respective transistors are all so constituted so as not to exceed predetermined values, and preferably so as to be nearly identical. With such a construction, the phenomenon of a parasitic thyristor (latch-up) can be avoided.

As an example of a structure of the device in which the constitution described above is definitely realized, collector electrode connection layers are disposed between base impurity introducing layers of the respective transistors arranged at the semiconductor substrate at predetermined intervals. More preferably, these electrode connecting layers are disposed substantially at central positions of the spaces between the respective base impurity introducing layers arranged with the predetermined intervals.

DESCRIPTION OF THE PREFERRED EMBODIMENTS

The present invention was invented in the process of the development of an IC (hereinafter referred to as a Bi-MOS IC) in which bipolar elements and MOS elements coexisted. Therefore, the embodiments hereinunder introduced will be also Bi-MOS devices. However, as to be described later, the application of the present invention is not to be limited to Bi-MOS ICs, and can be applied to fine bipolar ICs, too.

Note that before the present invention the relation between the parasitic elements to be discussed had not clearly been recognized until it was made clear by the inventors of the present invention. Note also that the present invention was made in the process of finding counter-measures for avoiding the phenomenon of parasitic elements with simple constitution and without adversely effecting integration, and that the invention is especially effective for complex and highly integrated ICs such as Bi-MOS ICs.

First, the points of issues which were made clear by the inventors of the present invention will be hereinunder introduced, and then the preferred embodiments of the present invention will be described with reference to the related drawings.

The Points of Issues Studied and Made Clear by the Inventors of the Present Invention Before the Present Invention Hitachi, Ltd. had developed a complex switching circuit employing bipolar elements and MOS elements, and a logic IC or a memory IC which had incorporated a complex switching circuit.

As an example of the patent application of a switching circuit, there is:

A. Uragami et al, U.S. Patent Application Ser. No. 716,151.

As an example of a patent application for a memory IC, there is:

K. Mitsumoto et al, U.S. Patent Application Ser. No. 745,424.

(a) Consideration of the Mechanism of the Parasitic Thyristor as a Circuit

Figure 1:
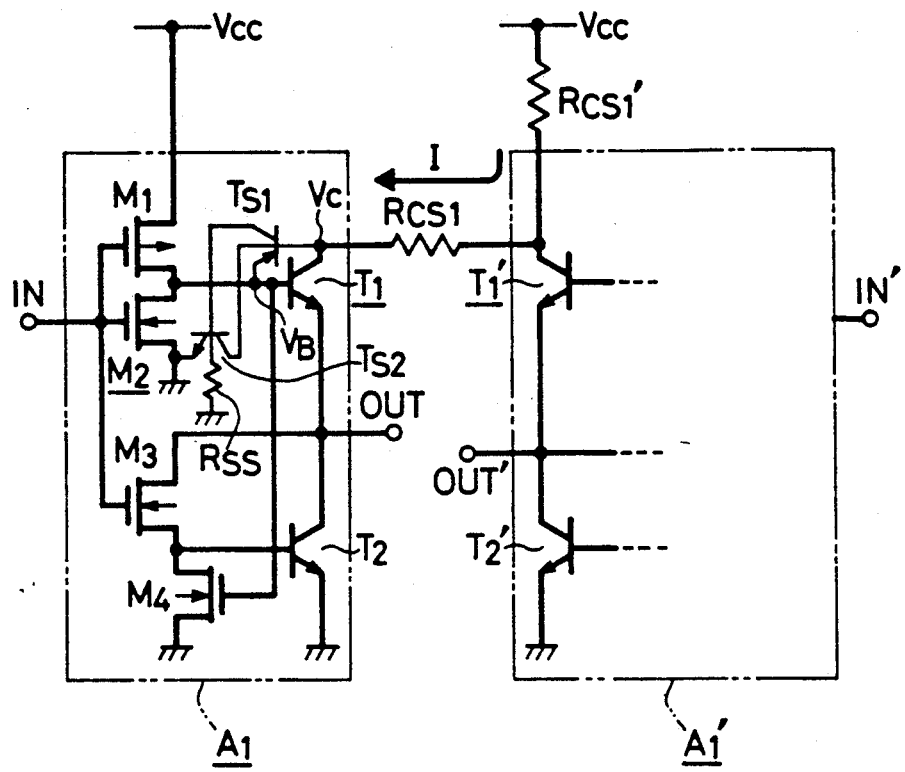
FIG. 1 shows an embodiment of a Bi-MOS complex switching circuit developed by Hitachi, Ltd., and describes problems related to highly integrated collector-grounded NPN transistors $T_1$ and $T_1'$.
Figure 2:
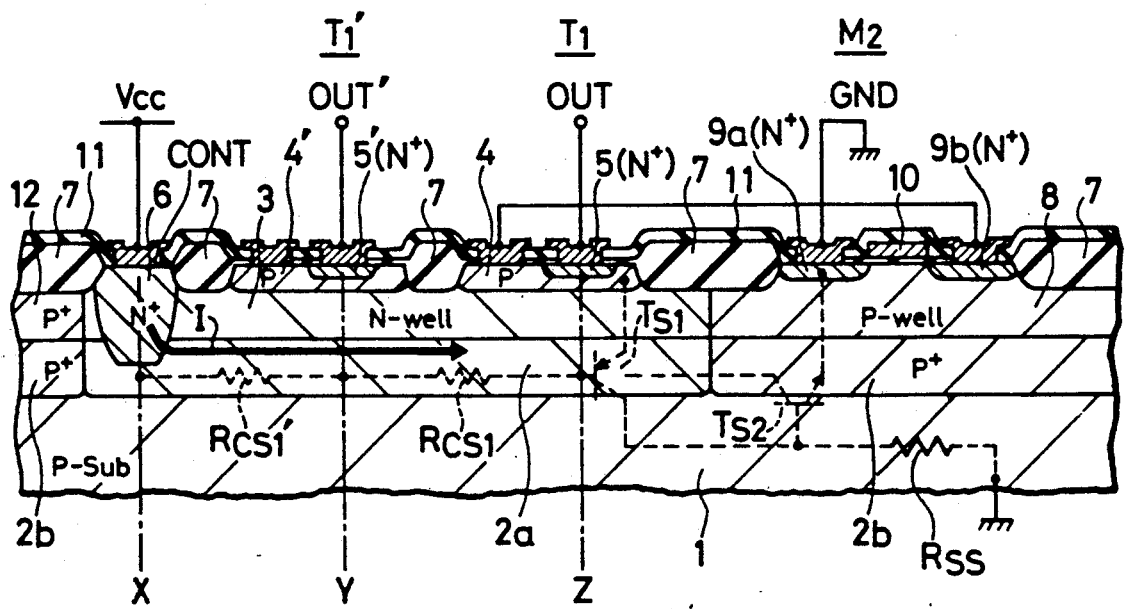
FIG. 2 is a cross-sectional view of an IC device incorporating the transistors $T_1$ and $T_1'$ and the MOSFET ($M_2$) shown in FIG. 1, and describes the generation of a parasitic thyristor.

FIG. 1 shows an embodiment of a Bi-MOS complex switching circuit and FIG. 2 is a cross-sectional view of an IC device incorporating a main portion of the switching circuit shown in FIG. 1. In FIG. 1, parts drawn by relatively thick lines show the original circuit structure and parts drawn by relatively thin lines show parasitic elements. The portion A1 (or portion A1') surrounded by dot lines in FIG. 1 shows a Bi-MOS switching circuit. Operation of this Bi-MoS switching circuit shown in FIG. 1 will first be briefly described. When an "H" level signal is applied to an input terminal IN, the output of a CMOS inverter consisting of an N-MOSFET ($M_1$) goes to "L" and a collector-grounded transistor T1, i.e. an upper step transistor of the output stage transistors, goes OFF. An N-MOSFET ($M_3$) goes ON and drives a base of a transistor $T_2$ to make it ON and the output goes to "L".

Conversely, when the input signal goes to the "L" level, the N-MOSFET ($M_3$) goes OFF and the output of the CMOS inverter goes to "H". As a result, the collector-grounded transistor (emitter follower) $T_1$ goes ON, the transistor $T_2$ goes OFF, and the output turns to "H".

Now the phenomenon of parasitic elements, which is likely to occur in this complex switching circuit, is described. As previously mentioned, when the input signal is "L", the emitter follower $T_1$ of the output stage is ON, but at that time, relatively large current I is applied from a source $V_{cc}$ through the collector, base and emitter of the transistor $T_1$. This current I produces voltage drops by parasitic resistances $R_{CS1}$ and $R_{CS1}'$ existing in series between the collector of the transistor $T_1$ and the source $V_{cc}$ line so that the collector potential $V_c$ of the transistor $T_1$ becomes lower than the source potential $V_{cc}$.

If the potential difference between the base potential $V_B$ and the collector potential $V_c$ of the transistor $T_1$ exceeds a certain value, a parasitic substrate PNP transistor $T_{S1}$ goes ON and further a parasitic transistor $T_{S2}$ goes ON so that a parasitic thyristor is formed. Thus, if the parasitic thyristor operates, a large current is applied from the source $V_{cc}$ to the ground line intermittently and, in the worst case, the output stage transistor $T_1$ or source diffusion layers of the N-MOSFET ($M_2$) are broken down.

(b) Consideration of the Mechanism of the Generation of the Parasitic Thyristor as a Device The constitution of the parasitic elements or the like described above in an actual IC is hereinunder described with reference to FIG. 2.

FIG. 2 shows the collector-grounded transistor $T_1$ of the output stage and the N-MOSFET ($M_2$) of the input stage in the elements constituting one complex switching circuit Al and the collector-grounded transistor $T_1'$ of the output stage of the other complex switching circuit $A_1'$, both shown in FIG. 1.

First, the structure of the IC shown in FIG. 2 will be briefly described. This structure is formed with the fine process technology developed by Hitachi, Ltd.

In a main surface of a semiconductor substrate 1 such as a P-type single crystal silicon substrate, a nitride film is formed. Then an N-type impurity such as antimony is introduced into the substrate 1 utilizing the nitride film as an impurity introducing mask and an $N^+$-type buried layer 2a as the first collector layer is formed. After an oxide film is formed on the $N^+$-type buried layer 2a by thermal film is removed and P-type impurity such as boron is introduced utilizing the oxide film as an impurity introducing mask to form $P^+$-type buried layer 2b with self-alignment against the N-type buried layer 2a. An N--type epitaxial layer is made to grow on the buried layers 2a and 2b and, with the same method as for making two buried layers 2a and 2b, an N-type well 3 (N-type impurity is phosphor) and a P-type well 8 (P-type impurity is boron) are formed. At the N-type well 3, base regions 4 and 4' as base impurity introducing layers and emitter regions 5 and 5' as emitter impurity introducing layers of the bipolar transistor are formed, as well as source and drain regions of the P-channel type MOSFET. The source region 9a and the drain region 9b of the N-channel type MOSFET are then formed in the P-type well 8. The collector impurity introducing region of the NPN transistor is comprised of the N-type well 3 and the $N^+$-type buried layer 2a. The collector impurity introducing region may be hereinafter referred to simply as the collector region.

Note such excellent features as the fact that as the P-type and N-type wells and the P-type and N-type buried layers formed on them are provided, isolation is prepared by the device itself and that only one mask is utilized to form the above four layers. Also, as the P-type and N-type buried layers are provided, base consistency of parasitic PNP and NPN transistors is high so that latch-up in the CMOS is unlikely to occur.

In order to achieve high integration of a plurality of the collector-grounded output transistors $T_1$ and $T_1'$, a plurality of the P-type base regions 4 and 4' and a plurality of the N-type emitter regions 5 and 5' are formed in the common N-type well 3. Moreover, in the N-type well 3, one $N^+$-type collector electrode connecting layer 6 is so formed as to reach the $N^+$-type buried layer 2a. The reference numeral 7 denotes a selective oxide film (LOCOS) for separating elements formed in the main surface of the semiconductor substrate 1 from each other. The reference number 10 denotes a gate electrode of the MOSFET such as polycrystal silicon; 11, a layer insulation film such as silicon oxide film formed by chemical vapor deposition method; and 12, a channel stopper layer.

In the bipolar transistor of the structure shown in FIG. 2, only one collector electrode connecting layer 6 is provided for the $N^+$-type buried layer 2a, which is the common collector region. When a collector current (I) is applied to the transistor $T_1$ which is the most distant from the collector electrode connecting layer 6, the potential of the $N^+$-type buried layer 2a is locally reduced due to the resultant impedance of diffusion resistances $R_{CS1}'$ and $R_{CS1}$ of the $N^+$-type buried layer 2a. By this potential drop, the P-type base region 4 and the collector regions 2a and 3 are normally biased, and the parasitic transistor $T_{S1}$ goes conductive. Then the parasitic transistor $T_{S2}$ also goes ON and, as a result, a large current is applied from $V_{cc}$ to the source diffusion layer 9a (kept at ground potential) of the N-MOSFET ($M_2$).

The diffusion resistances $R_{CS1}'$ and $R_{CS1}$ as the impedance components mentioned above are the parasitic resistance values existing between the contact portion (cont) of the constant potential ($V_{cc}$) line with the collector electrode connecting layer 6 and the intrinsic collector operation regions (which correspond to the collector regions 2 and 3a provided beneath the emitter regions) of the respective transistors.

In FIG. 2, the parasitic resistance between the contact portion (CONT) and the intrinsic collector operation region of the transistor $T_1'$ is expressed as the resistance $R_{CS1}'$ between X and Y and the parasitic resistances between the contact portion (CONT) and the intrinsic collector operation region of the transistor $T_1$ are expressed as the resistances $R_{CS1}'$ and $R_{CS1}$ between X and Z for simplification.

As understood from FIG. 2, the parasitic resistance $R_{SC1}'$ of the transistor $T_1'$ overlaps X and Z so that the parasitic resistance of the transistor $T_1$ is the large resultant resistance of the resistances $R_{CS1}'$ and $R_{CS1}$.

The parasitic phenomenon (latch-up) described above is a special latch-up phenomenon generated between the collector-grounded bipolar transistor $T_1$ and the source-grounded N-MISFET ($M_2$ or $M_4$).

To avoid the latch-up phenomenon in the basic gate circuit as described above and to improve reliability, it would be possible to use a method wherein the collector-grounded transistors are formed in separated, buried layers. However, with this method, the layout area cannot be reduced. In highly integrated semiconductor memory devices, gate arrays and the like, the same types of basic gate circuits or basic cells are formed repeatedly. If the layout area of the basic gate circuit cannot be reduced, the whole chip area must be increased, and that is quite inconvenient.

Embodiment 1

Figure 3:
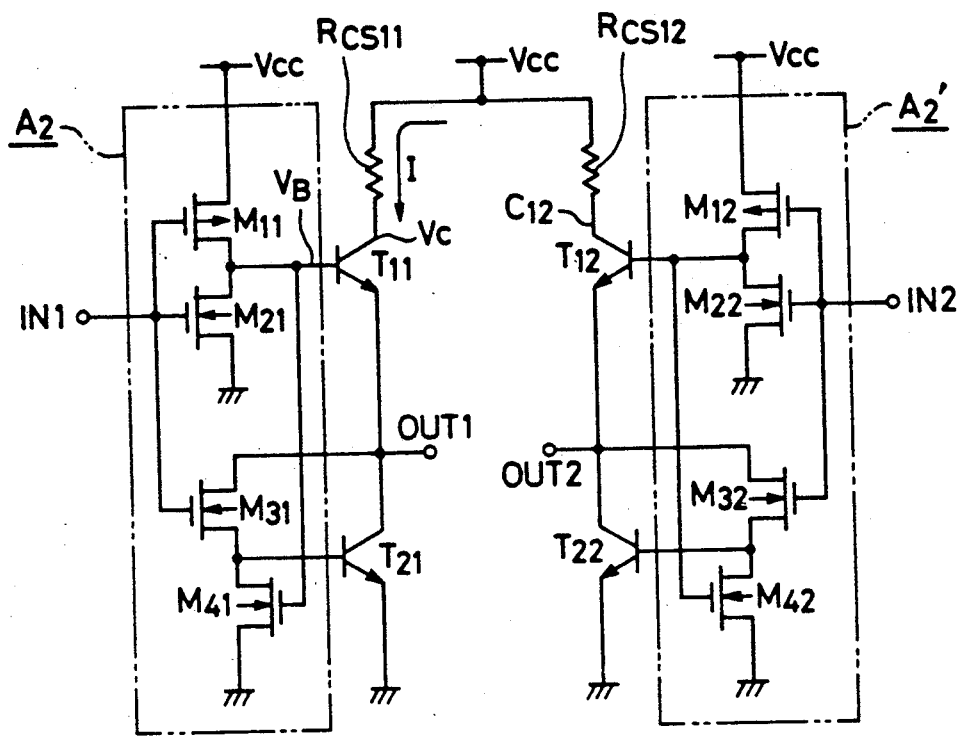
FIG. 3 is a circuit diagram of a Bi-MOS complex switching circuit to which the present invention is applied, and shows that parasitic resistances $R_{SC11}$ and $R_{SC12}$ between the $V_{cc}$ line and the collectors of the respective transistors are connected to the respective transistors.
Figure 4:
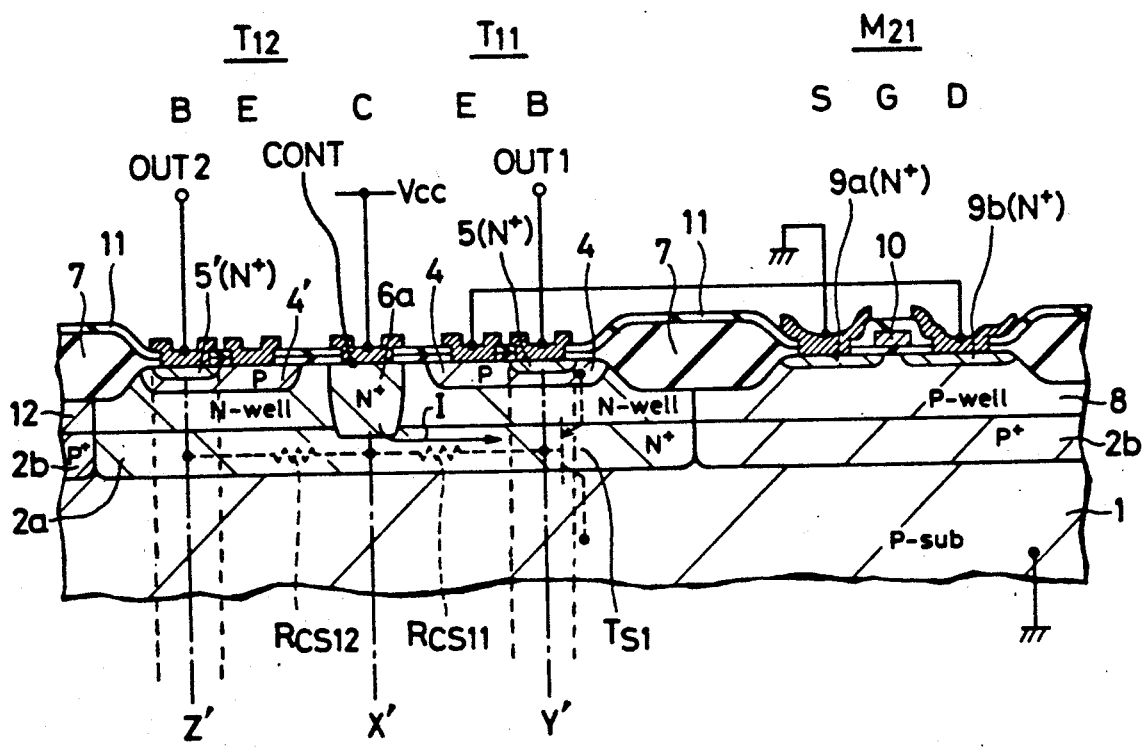
FIG. 4 is a cross-sectional view of an IC incorporating the transistors $T_{11}$ and $T_{12}$ and the MOSFET ($M_{21}$) shown in FIG. 3, and shows that a collector electrode connecting layer 6a is disposed at the center between base impurity introducing layers 4 and 4' arranged with a predetermined interval.

The first embodiment of the present invention will be hereinunder described with reference to FIG. 3 and FIG. 4. FIG. 3 is a circuit diagram of a complex switching circuit to which the present invention is applied and FIG. 4 is a sectional view of the IC device of the main portion of the circuit shown in FIG. 3.

If FIG. 3 is compared to FIG. 1, the following difference will be understood. In FIG. 1, parasitic resistances $R_{CS1}$ and $R_{CS1}'$ exist in series between the collector of the output stage transistor $T_1$ and the $V_{cc}$ line, while in FIG. 3, only one parasitic resistance $R_{CS11}$ (corresponding to the resistance $R_{CS1}$ in FIG. 1) exists between the collector of the output stage transistor $T_{11}$ (corresponding to the transistor $T_1$ in FIG. 1) and the $V_{cc}$ line. In other words, series parasitic resistances overlapping between the $V_{cc}$ line and of the respective transistors do not exist.

Therefore, even if the transistor $T_{11}$ goes ON and a current I is applied to the collector-emitter line of the transistor, the potential drop caused by the resistance $R_{CS11}$ is less than the potential drop in the case of FIG. 1 so that the collector potential $V_c$ of the transistor $T_{11}$ does not decline nearly as much from the source potential $V_{cc}$ as the collector potential of transistor $T_1$ of FIG. 1 did.

Therefore, even in the worst case, the voltage between the base and the emitter of the parasitic PNP transistor $T_{S1}$ shown in FIG. 1 barely exceeds the predetermined value (threshold voltage of the parasitic transistor operation) so that the parasitic transistor $T_{S1}$ barely goes ON. Therefore, for practical purposes, this transistor is substantially OFF.

FIG. 4 is a sectional view of the device. At a P-type single crystal semiconductor substrate, a collector electrode connecting layer 6a which is to be a common electrode of bipolar transistors $T_{11}$ and $T_{12}$ formed on a common N-type buried layer 3 which is to be the first collector layer is disposed between P-type base regions 4 and 4' which are to be base impurity introducing layers of the respective transistors. In other words, collector impurity introducing layers 3 and 2a are commonly provided for the respective transistors and the first collector layer 2a is their extension beneath the base impurity introducing layers 4 and 4' of the respective transistors. The position where the collector electrode connection layer 6a is formed is such that values of parasitic resistances $R_{CS11}$ and $R_{CS22}$ of the buried layer 2a are nearly identical. In other words, the collector electrode connecting layer 6a provided for connecting the constant potential ($V_{cc}$) line with the first collector layer 2a is disposed at nearly the central position of the space between the base regions 4 and 4' of the respective transistors which are provided with a predetermined interval. Therefore, even if one output transistor $T_{11}$ goes ON and a collector current I is applied, only the potential drop caused by the parasitic resistance $R_{CS11}$ is produced so that the parasitic transistor $TS_{11}$ barely conducts. That is to say, the base region 4 and the collector region, or the N-type well 3, of the transistor $T_{11}$ and the buried layer 2a is just slightly normally biased.

In FIG. 4, X', Y' and Z' correspond to X, Y and Z in FIG. 2 respectively. The parasitic resistance value between the connecting part (CONT) of the constant potential ($V_{cc}$) line with the collector electrode connecting layer 6a and the intrinsic collector operation region of the transistor $T_{11}$ is expressed as the resistance $R_{CS11}$ between X' and Z' and the parasitic resistance value between the contact portion (CONT) and the intrinsic collector operation region of the transistor $T_{12}$ is expressed as the resistance $R_{CS12}$ between X' and Y'.

The intrinsic collector operation regions mentioned above mean those portions of the collector layers 2a and 3 located directly beneath the emitter impurity introducing layers 5 and 5' of respective transistors $T_{11}$ and $T_{12}$. The positions of the intrinsic collector operation regions are roughly indicated by Y' and Z' in the drawing. Those positions Y' and Z' are aligned with the centers of the emitter impurity introducing layers 5 and 5'. More specifically, the intrinsic collector operation regions are defined by those portions of the collector layers 2a and 3 which fall within vertical perpendicular projection lines of the emitter regions 5 and 5'. These vertical perpendicular projection lines are shown as dashed lines in FIG. 4, centered around lines Z' and Y'.

As shown in FIG. 4, the potential of the substrate 1 is not increased by disposing the collector electrode connecting layer 6a. As a result, even if an N-channel type MOSFET ($M_{21}$) exists close to those highly integrated output transistors $T_{11}$ and $T_{12}$, the latch-up phenomenon is not generated. Therefore, in making the layout of the Bi-MOS complex switching circuit incorporating bipolar transistors and MOSFETs highly integrated, it is not necessary to consider latch-up. As a plurality of transistors are formed on a common $N^+$-type buried layer, a higher degree of integration can be obtained compared to the case when individual transistors are formed on individually separated $N^+$-type buried layers, and the layout of the whole circuit is not increased very much.

Moreover, in the portion (between the base regions 4 and 4') where the selective oxide film 7 for separation is formed in the structure shown in FIG. 2, the selective oxide film 7 is not formed. Instead, the collector electrode connecting layer 6a is formed so that the layout area can be reduced compared to the device structure shown in FIG. 2. In a selective oxide film for separation such as that shown in FIG. 2, the so-called bird's beak and bird's head exist, and the layout area must be increased to accommodate those parts.

Figure 5:
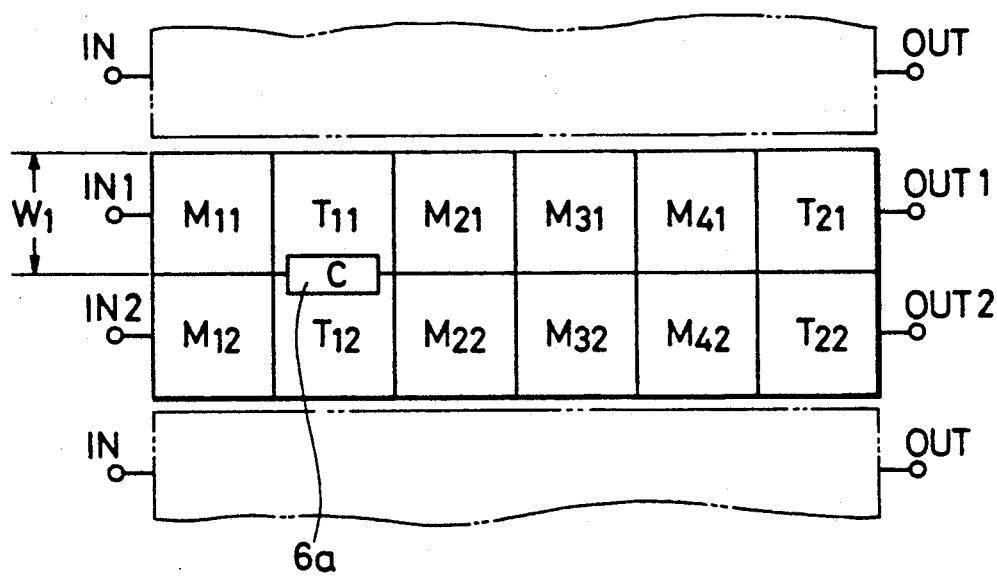
FIG. 5 is a layout diagram of the device showing a highly integrated layout of the Bi-MOS complex switching circuit shown in FIG. 3.

FIG. 5 is a top view showing the arrangement of respective elements in the device into which the circuit shown in FIG. 3 is integrated. The collector electrode connecting layer 6a is disposed between the emitter follower transistors $T_{11}$ and $T_{12}$. It is understood from FIG. 5 that elements ($M_{11}$, $M_{21}$, $M_{31}$, $M_{41}$ and $T_{21}$ or $M_{21}$, $M_{22}$, $M_{32}$, $M_{42}$ and $M_{22}$) constituting one Bi-MOS complex switching circuit are all contained within a width $W_1$, and a very high degree of integration is obtained.

Figure 6:
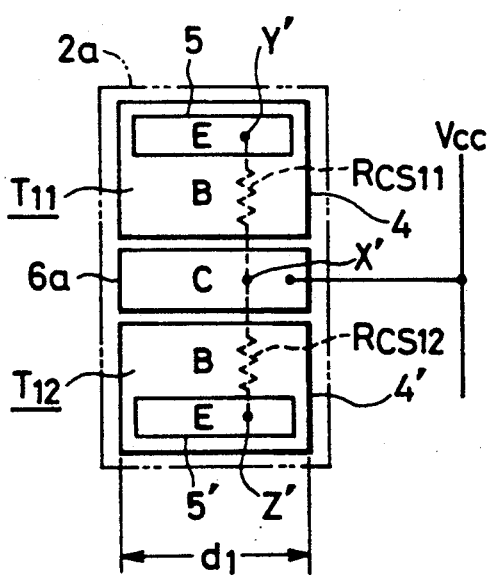
FIG. 6 is an enlarged layout diagram of the device showing the portion of the highly integrated collector-grounded NPN transistors $T_{11}$ and $T_{12}$ given in FIG. 5.

FIG. 6 is an enlarged view of the portion of the emitter follower transistors $T_{11}$ and $T_{12}$ shown in FIG. 5. The collector electrode connecting layer 6a is provided at the center between the transistors $T_{11}$ and $T_{12}$ so that the parasitic resistances $R_{CS11}$ and $R_{CS12}$ are nearly identical. It is understood from FIG. 6 that the width $d_1$ of the collector electrode connecting layer 6a and the widths of the base regions 4 and 4' of the respective transistors $T_{11}$ and $T_{12}$ are identical so that high integration is obtained. Moreover, the base regions 4 and 4' and the emitter regions 5 and 5' are arranged symmetrically to the collector electrode connecting layer 6a so that the parasitic resistances $R_{CS11}$ and $R_{CS12}$ are identical.

Figure 7:
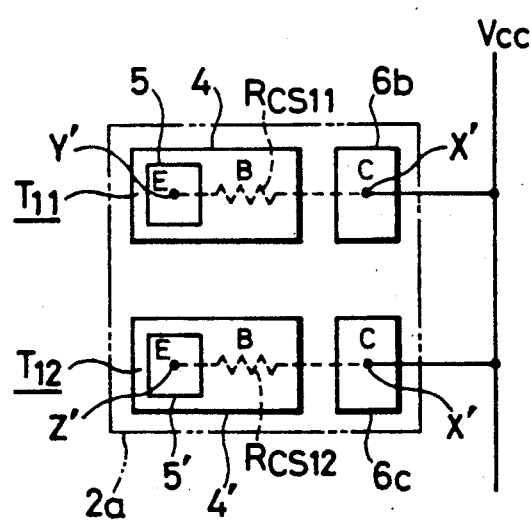
FIG. 7 is a layout diagram of the device of another modification of the present invention wherein collector electrode connecting layers are provided for the transistors $T_{11}$ and $T_{12}$ individually.

The transistors $T_{11}$ and $T_{12}$ can also be arranged like the device layout shown in FIG. 7. It is understood from FIG. 7 that collector electrode connecting layers 6b and 6c are provided for the respective transistors $T_{11}$ and $T_{12}$ and the parasitic resistances $R_{CS11}$ and $R_{CS12}$ of the respective transistors $T_{11}$ and $T_{12}$ are nearly identical.

Embodiment 2

Figure 8:
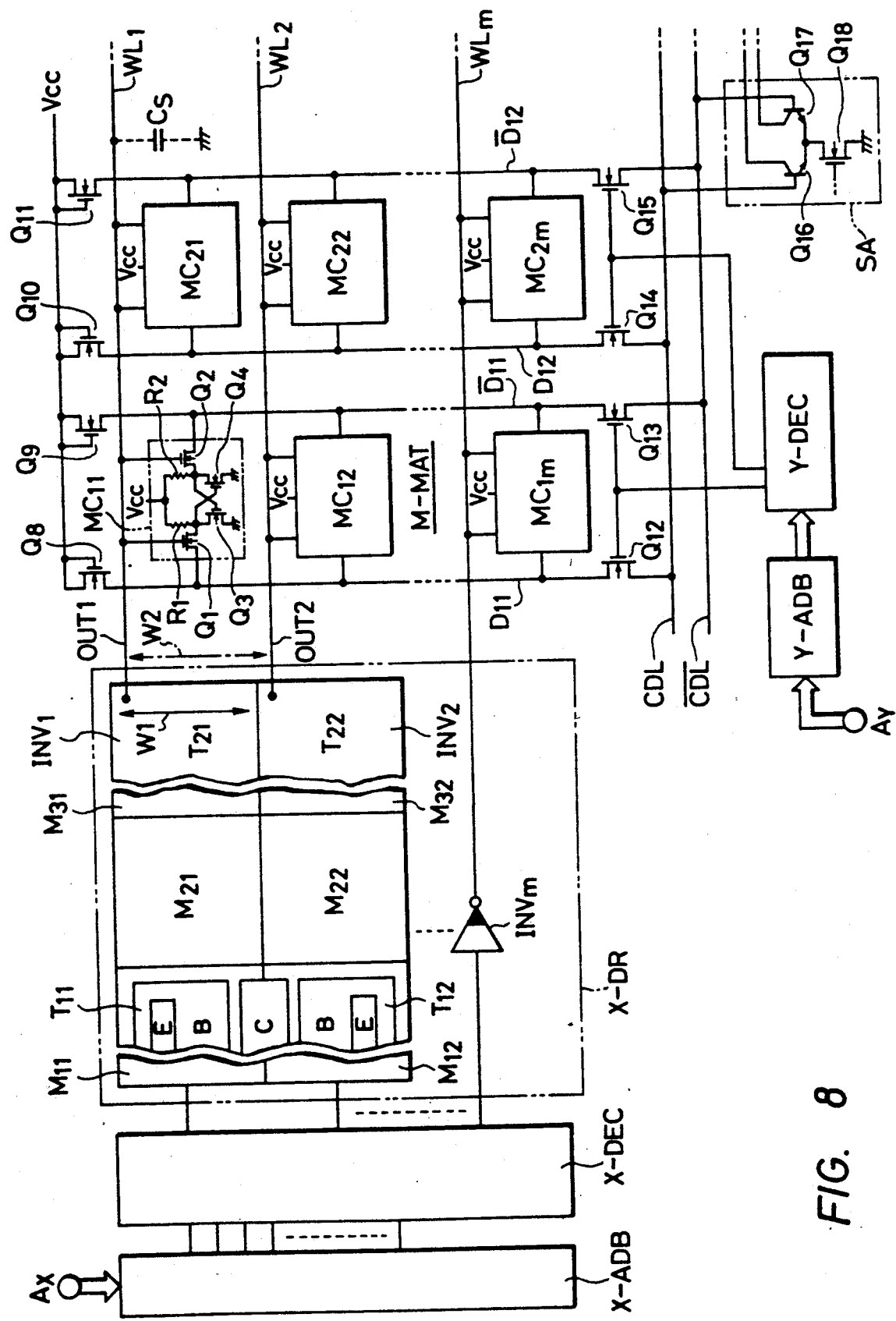
FIG. 8 is a circuit diagram showing that the Bi-MOS complex switching circuit of the layout given in FIG. 6 is employed as a word line driver of the Bi-MOS SRAM (Static Random Access Memory) developed by Hitachi, Ltd.

FIG. 8 shows the structure of the Bi-CMOS SRAM developed by HItachi, Ltd. to which the present invention is applied.

First, the outline of the Bi-CMOS SRAM will be described and then the advantage obtained by the application of the present invention will be described.

As shown in FIG. 8, conventional flip-flop memory cells $MC_{11}$ - $MC_{1m}$ and $MC_{21}$ - $MC_{2m}$ and complementary data line pairs $D_{11}/\overline{D}_{11}$ and $D_{12}/\overline{D}_{12}$ connected to these memory cells are provided and precharge MOSFETs $Q_8$-$Q_{11}$ and Y-switch MOSFETs $Q_{12}$-$Q_{15}$ are connected to these complementary data line pairs $D_{11}/\overline{D}_{11}$-$D_{12}/\overline{D}_{12}$. The complementary data line pairs $D_{11}/\overline{D}_{11}$ and $D_{12}/\overline{12}$ are connected to a differential pair bipolar sensing amplifier SA through a common data line pair CDL/$\overline{CDL}$.

Word lines $WL_1$-$WL_m$ connected to the memory cells $MC_{11}$-$MC_{1m}$ are selectively driven in accordance with an X-address signal $A_X$ by inverters (Bi-MOS complex switching circuits) $INV_1$-$INV_m$ constituting a word line driver X-DR.

It is understood from FIG. 8 that the device layout of the complex switching circuit shown in FIG. 5 is applied to the inverters $INV_1$ and $INV_2$. A part of the device layout shown in FIG. 5 is deleted from the device layout shown in FIG. 8 due to the space in the drawing.

It is understood from FIG. 8 that the width $W_1$ of the inverter $INV_1$ to which the present invention is applied is the same as the width $W_2$ of the memory cell $MC_{11}$ so that as many necessary inverters as the number of word lines $WL_1$-$WL_m$ can be arranged in a highly integrated manner. Moreover, although this structure easily forms the parasitic transistor $T_{S1}$, because the word lines $WL_1$-$WL_m$ are long and many transfer MOSs (for instance MOSs $Q_1$ and $Q_2$ in the memory cell $MC_{11}$) are connected to them and the load capacity Cs is large, and large current must be applied to the emitter follower transistors $T_{11}$ and $T_{12}$ in order to achieve high speed operation, the parasitic transistor does not go ON and latch-up does not occur in the present invention.

It is to be understood that the above-identified arrangements are simply illustrative of the application of the principles of this invention. Numerous other arrangements may be readily devised by those skilled in the art which embody the principles of the invention and fall within its spirit and scope.

We claim:

1. A semiconductor memory device comprising:
a semiconductor substrate having a main surface;
a plurality of memory cells formed on said main surface, said memory cells being arranged in a row direction and a column direction so as to form a memory cell matrix which comprises a plurality of memory rows and a plurality of memory columns;
means responsive to address signals for selecting at least one memory cell from among a plurality of said memory cells in accordance with the address signals, said selecting means including row selecting means for selecting one memory row from among a plurality of said memory rows, and column selecting means for selecting at least one memory column from among a plurality of said memory columns, wherein said at least one memory cell to be selected corresponds to a memory cell arranged at a portion where said one memory row and said one memory column intersect, wherein said row selecting means is coupled to a plurality of word lines and brings one of said word lines into a selected state to select one memory row, and wherein said row selecting means further includes a plurality of gate circuits, each having a collector-grounded bipolar transistor whose emitter region is coupled to a corresponding word line, formed on said main surface; and
a source line for supplying an operating voltage to said gate circuits.
wherein said collector-grounded bipolar transistors of said gate circuits have a common collector region, wherein each of said collector-grounded bipolar transistors includes a base and an emitter region formed in each base region, and wherein said source line is coupled to a contact portion of said common collector region which is disposed between said base regions of said collector-grounded bipolar transistors.

2. A semiconductor memory device according to claim 1, wherein said gate circuits include a plurality of word driver circuits, and wherein each word driver circuit includes an output stage including one or more of said collector-grounded bipolar transistors.

3. A semiconductor memory device according to claim 2, wherein said collector-grounded bipolar transistors operate to charge a load capacity of a corresponding word line.

4. A semiconductor memory device according to claim 2, wherein each of said word driver circuits includes a CMOS circuit having an input and an output, and wherein said base regions of said collector-grounded bipolar transistors are coupled to said outputs of said CMOS circuits, respectively.

5. A semiconductor memory device according to claim 1, wherein each of said plurality of memory cells includes a plurality of resistance elements and a plurality of MOS elements.

6. A semiconductor memory device according to claim 4, wherein said resistance elements and said MOS elements in each of said memory cells are arranged to form a static memory cell.

* * * * *